(12) United States Patent
Bao et al.

(10) Patent No.: US 7,569,416 B2
(45) Date of Patent: Aug. 4, 2009

(54) FORMING CLOSELY SPACED ELECTRODES

(75) Inventors: Zhenan Bao, Stanford, CA (US); Jie Zheng, Atlanta, GA (US); James C. Sturm, Princeton, NJ (US); Troy Graves-Abe, Princeton, NJ (US)

(73) Assignees: Alcatel-Lucent USA Inc., Murray Hill, NJ (US); Office of Technology Licensing & Intl Property, Princeton, NJ (US)

( * ) Notice: Subject to any disclaimer, the term of this patent is extended or adjusted under 35 U.S.C. 154(b) by 595 days.

(21) Appl. No.: 11/424,655

(22) Filed: Jun. 16, 2006

(65) Prior Publication Data

US 2007/0069243 A1 Mar. 29, 2007

Related U.S. Application Data

(62) Division of application No. 10/803,244, filed on Mar. 18, 2004, now Pat. No. 7,119,356.

(60) Provisional application No. 60/488,168, filed on Jul. 18, 2003.

(51) Int. Cl.
*H01L 21/00* (2006.01)
(52) U.S. Cl. .................. 438/99; 977/858; 977/891
(58) Field of Classification Search ............ 438/99; 977/858, 890, 891
See application file for complete search history.

(56) References Cited

U.S. PATENT DOCUMENTS 7,015,062 B1 * 3/2006 Weiss et al. ............. 438/99

| | | | |
|---|---|---|---|
| 2002/0167003 A1 | 11/2002 | Campbell et al. |
| 2002/0171125 A1 | 11/2002 | Bao et al. |
| 2003/0047796 A1 | 3/2003 | Bao et al. |
| 2004/0026714 A1 | 2/2004 | Krieger et al. |
| 2004/0185600 A1 | 9/2004 | Kagan et al. |
| 2004/0245550 A1 | 12/2004 | Afzali-Ardakani et al. |

OTHER PUBLICATIONS

Stephen D. Evans, Abraham Ulman, Kim E. Goppert-Beraducci and Louis J. Gerenser; "Self Assembled Multilayers of w-Mercaptoalkanoic Acids; Selective Ionic Interactions"; J. American Chemical Society 1991; pp. 5866-5868.

C. Zhou, M.R. Deshpande, M.A. Reed, L. JonesII and J.M. Tour; "Nanoscale Metal/Self Assembled Monolayer/Metal Heterostructures"; Appl. Physics Letter 71, Aug. 4, 1997; pp. 611-613.

X D Cui, X. Zarate, J. Tomfohr, O F Sankey; A. Primak, A L Moore, T A Moore, D. Gust, G Harris and S M Lindsay; "Making Electrical Contacts to Molecular Monolayers"; Nanotechnology 13 2002; pp. 5-14.

(Continued)

Primary Examiner—W. David Coleman

(57) ABSTRACT

The present invention provides an apparatus and a method of fabricating the apparatus. The apparatus comprises a substrate having a planar surface and first and second electrodes located on the planar surface. The first electrode has a top surface and a lateral surface, and the lateral surface has an edge near or in contact with the substrate. An electrode insulating layer is located on the top surface and a self-assembled layer located on the lateral surface. The second electrode is in contact with both the self-assembled layer and the electrode insulating layer.

14 Claims, 11 Drawing Sheets

OTHER PUBLICATIONS

Mathias Brust, Peter M. Blass and Allen J. Bard; "Self Assembly of Photoluminescent Copper (I) Dithiol Multilayer Thin Films and Bulk Materials"; 1997 American Chemical Society; pp. 5602-5607.

Tina Louise Brower, Myneeka Cook and Abraham Ulman; "Mixed Self-Assembled Multilayer of 4,4'-Dimercaptobiphenyl and 1,8-Octanedithiol"; American Chemical Society.

JH Schon and Z. Bao; "Nonoscale Organic Transistors Based on Self-Assembled Monolayers"; American Institute of Physics 2002, vol. 80, No. 5; Feb. 4, 2002; pp. 847-849.

Jan Hendrik Schon, Hong Meng & Zhenan Bao; "Self Assembled Monolayer Organic Field Effect Transistors"; Letters to Nature, vol. 413, Oct. 18, 2001; pp. 713-716.

Z. Hatzor and P.S. Weiss; "Molecular Rulers for Scaling Down Nanostructures"; Science vol. 291; Feb. 9, 2001; pp. 1019-1020.

Merriam Webster Online Dictionary, definition of "opposite".

* cited by examiner

FORMING CLOSELY SPACED ELECTRODES

CROSS-REFERENCE TO RELATED APPLICATION

This Application is a Divisional of U.S. patent application Ser. No. 10/803,244 entitled, "FORMING CLOSELY SPACED ELECTRODES," to Zhenan Bao, et al., filed on Mar. 18, 2004 now U.S. Pat. No. 7,119,356, which is commonly assigned with the present invention and incorporated herein by reference as if reproduced herein in its entirety under Rule 1.53(b).

This Application claims the benefit of U.S. Provisional Application Ser. No. 60/488,168 filed on Jul. 18, 2003, entitled "MINIMAL-DEFECT MOLECULAR-SCALE ELECTRONIC DEVICES BY A SELF-ALIGNED INSULATING LAYER STRUCTURE," commonly assigned with the present invention and incorporated herein by reference.

GOVERNMENT CONTRACT

This invention was made with Government support under the Office of Naval Research Contract N00014-02-1-0750. The Government has certain rights in this invention.

TECHNICAL FIELD OF THE INVENTION

The present invention is directed, in general, to a method of manufacturing a semiconductor device and, more specifically, to the manufacture of a semiconductor device having closely spaced electrodes.

BACKGROUND OF THE INVENTION

As semiconductor devices are scaled down, the minimum feature size attainable with the use of traditional patterning techniques (e.g., about 5 nanometers), such as photolithography and e-beam lithography, are being reached. Therefore, there is increased interest in the use of alternative approaches to define device features using self-assembling layers that are generally self-assembled monolayers (SAMs). There have been attempts to fabricate closely spaced electrodes on substrates using SAMs which serve as spacers between electrodes. Attempts have also been made to use the SAMs as a channel region of a field-effect transistor (FET). Such processes, however, remain problematic because there is a low yield of functional devices, that is, devices that do not have short circuits or parasitic currents.

Accordingly, a semiconductor device having closely spaced electrodes separated by a self-assembled layer that is more resistant to short circuiting than existing semiconductor devices using SAMs electrode spacers, is needed.

SUMMARY OF THE INVENTION

The present invention recognizes that the low yield of previous semiconductor devices having electrodes separated by a SAM is due to defects in the packing of the SAM at the edges of electrodes. Forming an insulating cap aligned over at least one electrode, and using longer organic molecule in a self-assembling layer, result in an improvement in the yield of semiconductor devices.

One embodiment of the present invention provides an apparatus that comprises a substrate having a planar surface, and first and second electrodes located on the planar surface. The first electrode has a top surface and a lateral surface, the lateral surface having an edge near or in contact with the substrate. The apparatus further includes an electrode insulating layer located on the top surface and a self-assembled layer located on the lateral surface. The second electrode is in contact with both the self-assembled layer and the electrode insulating layer.

Another embodiment of the present invention provides a method for making the apparatus. The method comprises forming a first electrode on a planar surface of a substrate, where the first electrode has a top surface and a lateral surface. An electrode insulating layer is formed on the top surface and a self-assembling layer is formed on the lateral surface. The method also includes forming a second electrode on the planar surface such that the second electrode is in contact with both the self-assembling layer and the electrode insulating layer.

BRIEF DESCRIPTION OF THE DRAWINGS

The invention is best understood from the following detailed description, when read with the accompanying FIGUREs. Various features may not be drawn to scale and may be arbitrarily increased or reduced for clarity of discussion. Reference is now made to the following descriptions taken in conjunction with the accompanying drawings, in which.

DETAILED DESCRIPTION

The present invention benefits from new insights into the reasons for the high failure rate of previous devices having closely spaced electrodes separated by SAMs. It has been discovered that typical processes used to form electrodes results in the second-formed electrode overhanging the first-formed electrode, typically along an upper edge of the first electrode. It has been recognized that this overhanging area along the top edge of the first-formed electrode is generally much larger than the area along the side of the first-formed electrode. From a scientific and technological standpoint, it is the much smaller side region that is of interest, and the larger overhang on the top of the first-formed electrode is a parasitic region. The large area of the parasitic region leads to a high probability of electrical shorts or defects in the SAM that prevent the measurement of side-effects in the desired region. Moreover, it is very difficult to align the edges of the electrodes to eliminate this parasitic top region because conventional photolithography processing is not compatible with structures containing SAMs. It is further recognized that even if conventional processing could be used, overlap lengths on the order of the alignment tolerance would still be present.

Based on these new insights, an innovative method for fabricating closely spaced electrodes has been developed. Additionally, novel apparatus results from this method. An electrode insulating layer is formed as an insulating cap on the top surface of the first electrode to reduce the occurrence of shorts. The first electrode and electrode insulating layer are formed to be precisely aligned with each other so as to avoid a top surface of the first electrode from not being protected by the insulating cap. An enhanced self-assembled layer which can have multiple self-assembled monolayers, is more robust against penetration of conductive material from the second electrode than previously used SAMs. In contrast to previously used SAMs, which are generally less than about 4 nanometers thick, embodiments of the self-assembled layer can have a thickness of greater than about 4 nanometers. Such thicknesses are made possible because the self-assembled layer is formed by sequentially deposited and covalently linked monolayers of organic molecules.

Figure 1:
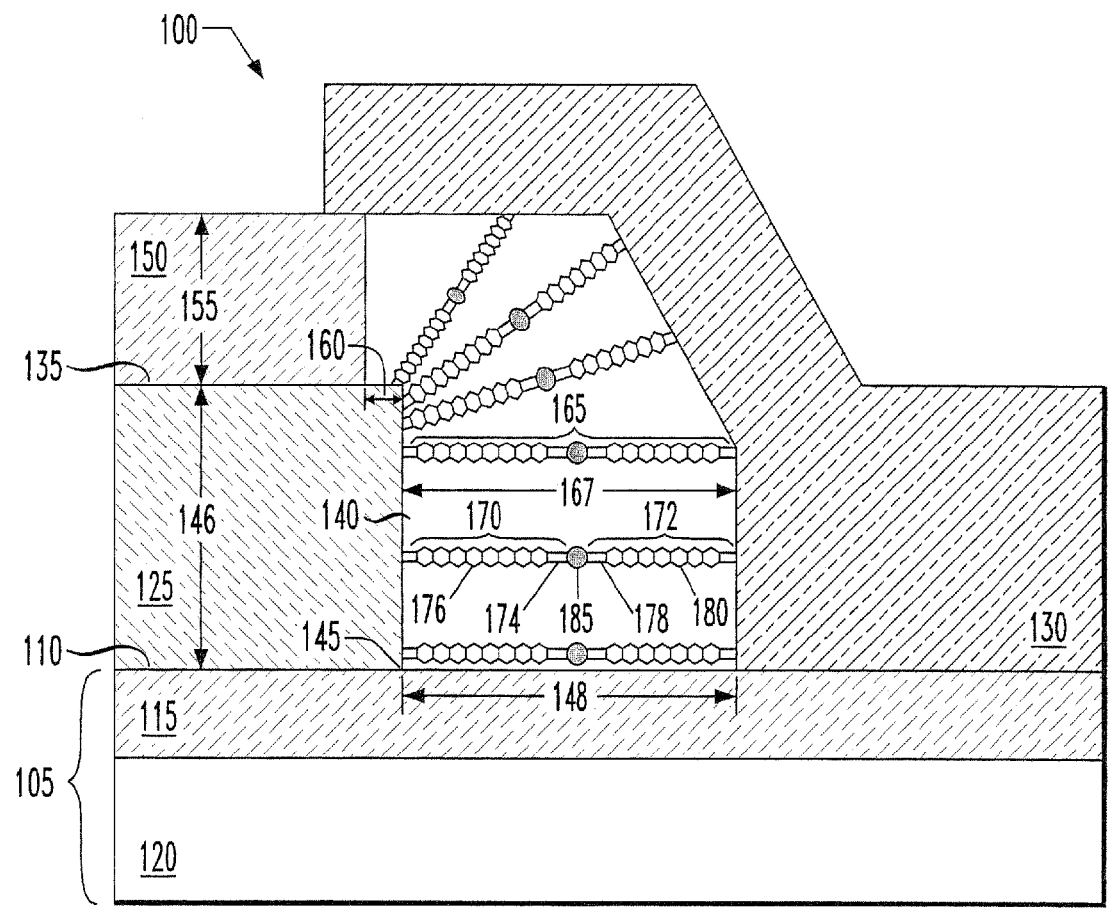
FIG. 1 schematically illustrates a detailed sectional view of an exemplary apparatus of the present invention.

FIG. 1 illustrates a schematic representation of a portion of an exemplary apparatus 100 of the present invention. In some preferred embodiments, the apparatus 100 is a three-terminal device such as a FET, and more preferably an organic field effect transistor (OFET). The apparatus 100 comprises a substrate 105 having a planar surface 110. Any conventional material used in semiconductor device fabrication, such as silicon, can be used for the substrate 105. In some preferred embodiments, the substrate 105 comprises an insulating layer 115 and a conducting layer 120, for use as a gate insulator and gate electrode, respectively. Examples of suitable insulating layer 115 materials are silicon or aluminum oxides, or organic dielectrics, such as polyimide or polydimethyl siloxane (PDMS). Doped silicon or conducting polymers can serve as the conducting layer 120. Suitable conducting polymers include polyanilines or polythiophene, that can be doped to increase conductivity, or conductive ink, comprising graphite and conducting polymers.

First and second electrodes 125, 130 are located on the planar surface 110. The first electrode 125 has a top surface 135 and a lateral surface 140. The lateral surface 140 of the first electrode 125 has an edge 145 near or in contact with the substrate 105. In some preferred embodiments, the First and second electrodes 125, 130 are source and drain electrodes in a FET device 100.

Suitable materials for the first electrode 125 include metals or other conductors that permit the formation of self-assembled layers thereon. Examples include gold, silver, platinum, and palladium, copper, highly doped silicon, and GaAs. Suitable materials for the second electrode 130 include metals such as gold, silver, platinum, and palladium, or conducting polymers, such as described above. Of course, as well understood by those skilled in the art, additional metals, such as titanium, can be included to promote the adhesion of metallic electrodes 125, 130 to the substrate 105. In some preferred embodiments for example the first electrode 125 has a thickness 146 of about 33 nanometers comprising a 30-nanometer thick layer gold on a 3-nanometer thick layer of titanium. In other preferred embodiments, the electrodes 125, 130 are separated by a distance 148 of less than about 5 nanometers, as defined by the length of the self-assembled layer.

The apparatus 100 further includes an electrode insulating layer 150 located on the top surface 135 of the first electrode 125. Suitable materials for the electrode insulating layer 150 include silicon dioxide, aluminum oxide, polyimide or PDMS. In some advantageous embodiments, the electrode insulating layer 150 has a thickness 155 of less than about 500 nanometers. In other instances, the insulating layer 150 has a thickness 155 of between about 3 and about 500 nanometers, and more preferably between about 100 and about 500 nanometers. It is preferable for the thickness 155 of the electrode insulating layer 150 to be greater than the separation distance 148 between the electrodes 125, 130. An electrode insulating layer thickness 155 that is greater than the electrode separation distance 148 is conducive to minimizing the extent of leakage current between the electrodes 125, 130 Additionally, because the first electrode 125 is protected by the electrode insulating layer 150, the second electrode 130 can substantially overhang the first electrode 125 without deleterious effects. This is in contrast to conventional devices, which attempted to minimize the overlap area between first and second electrodes 125, 130, to avoid the penetration of a SAM by conductive particles from the second electrode 130.

If a substantial portion of the top surface 135 is unprotected by the electrode insulating layer 150, however, then there is an increased risk of conductive particle penetration, and resultant short circuiting or increased parasitic currents. Therefore, it is desirable to ensure that the entire top surface 135 of the first electrode 125 is covered by the insulating layer 150. In certain advantageous embodiments, a footprint of the insulating layer 150 is substantially aligned with a footprint of the top surface of the first electrode 135. Substantially aligned insulating layer 150 and first electrode 125 footprints help to prevent conductive particles from the second electrode 130 from contacting the first electrode 125. As an example, in some preferred embodiments, the non-alignment distance 160 between the lateral surface 140 of the first electrode 125 and the insulating layer 150 is less than about 500 nanometers, and more preferably less than about 50 nanometers.

The apparatus 100 also includes a self-assembled layer 165 located on the lateral surface 140 of the first electrode 125. The second electrode 130 is in contact with both the self-assembled layer 165 and the insulating layer 150. In certain preferred embodiments, the self-assembled layer 165 is covalently bonded to the lateral surface 140.

The self-assembled layer 165 serves as a spacer to separate the first and second electrodes 125, 130. A self-assembled layer having a length 167 of at least about 5 nanometers is typically a sufficient separation of the first and second electrodes 125, 130 to prevent conductive materials from penetrating the self-assembled layer 165. Thus, in some instances, it is desirable for the self-assembled layer 165 to comprise a stack of at least two self-assembled layers 170, 172, as this helps prevent short circuits between the first and second electrodes 125, 130. In other instances, however, the self-assembled layer 165 can comprise a SAM, wherein the SAM comprises organic molecules each having a length of less than about 5 nanometers.

The stack of self-assembled layers 170, 172 can include an end group 174 of a first organic molecule 176 in the first self-assembled layer 170 chemically coupled to a second end group 178 of a second organic molecule 180 in a second self-assembled layer 172. Coupling between first and second end groups 174, 178 can be facilitated through the formation of a copper bridge 185 linking the first and second organic molecules 176, 180 together. As an example, a copper bridge 185 is formed when the first and second organic molecules 176, 180 having first and second end groups 174, 178 comprising mecapto- and carboxyl-groups, respectively, that are reacted with cupric perchlorate ($Cu(ClO_4)_2$), as further discussed below.

The term self-assembled layer 165 as used herein is defined as a layer of organic molecules whose long axes are substantially aligned in the same direction. The self-assembled layer 165 can comprise non-conductive or semiconductive organic molecules, or a combination of both. Of course, the first and second organic molecules 176, 180 of the self-assembled layer 165 can comprise the same or different semiconductive or insulating organic molecules. Examples of non-conductive molecules 176, 180 include omega-mercaptoalkanoic acids, such as mercaptoundecanoic acid (MUA).

It is preferable that the semiconductive molecules 176, 180 include a conjugated system of pi bonds, although any semiconductive materials of organic molecules are within the scope of the present invention. Examples include polythiophenes or oligothiophenes. For the purposes of the present invention, an oligothiophene has between 2 and 100 repeating units of thiophene, while polythiophene has greater than 100 repeating units of thiophene. Other semiconductive organic compounds, however, are also within the scope of the present invention. Nonlimiting examples include oligophenyl or polyphenyl compounds. The organic molecules 176, 180 can also comprise combinations of different benzoid aromatic ring structures like benzene, naphthalene or anthracene rings coupled to each other such as pentacene, nonbenzoid aromatic rings, heterocylic rings such as thiophene, or copolymers of these structures, such as copoly(bithiophene-fluorene). As noted above, it is preferable for these molecules to be functionalized with mercapto- and carboxyl-groups so as to facilitate their coupling to the first electrode as well as each other in the stacked self-assembled layer 170, 172.

In embodiments where the organic molecules 176, 180 are semiconductive, the self-assembled layer 165 can also advantageously serve as a channel region in an OFET device 100. In such embodiments, the self-assembled layer 165 preferably has a high field effect mobility, for example, greater than about $1 \times 10^{-3}$ cm$^2$ V$^{-1}$·s$^{-1}$, and more preferable greater than about 1 cm$^2$ V$^{-1}$·s$^{-1}$.

FIGS. 2 to 5 illustrate selected steps in another embodiment of the present invention, a method for manufacturing an apparatus 200 such as that depicted in FIG. 1. Any of the above-mentioned materials and structures can be advantageously used in the alternative method.

Figure 2:
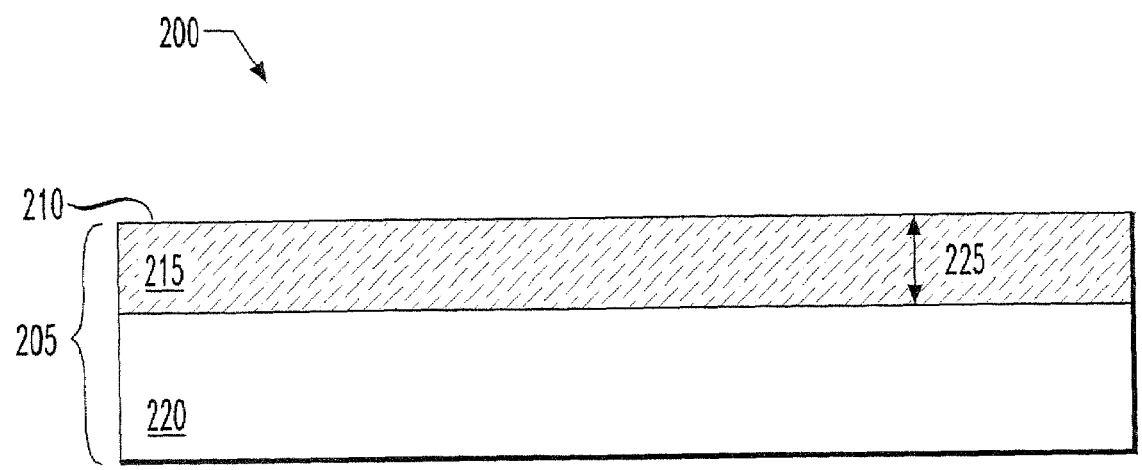
FIGS. 2 to 6 schematically illustrate sectional views of structures produced by an exemplary method of the present invention at various stages of manufacture.

Turning now to FIG. 2, the method includes providing a substrate 205 having a planar surface 210. The substrate 205 can be a gate structure, comprising an insulating layer 215 formed over a conductive layer 220. For instance, a silicon dioxide layer 215 having a thickness 225 of about 20 nanometers can be thermally deposited over phosphorous or boron-doped silicon 220, using conventional procedures well known to those skilled in the art. Alternatively, an organic insulating layer 215, such as polyimide or PDMS, can be deposited via spin coating or other conventional techniques over a metal conductive layer 220 such as gold.

Figure 3:
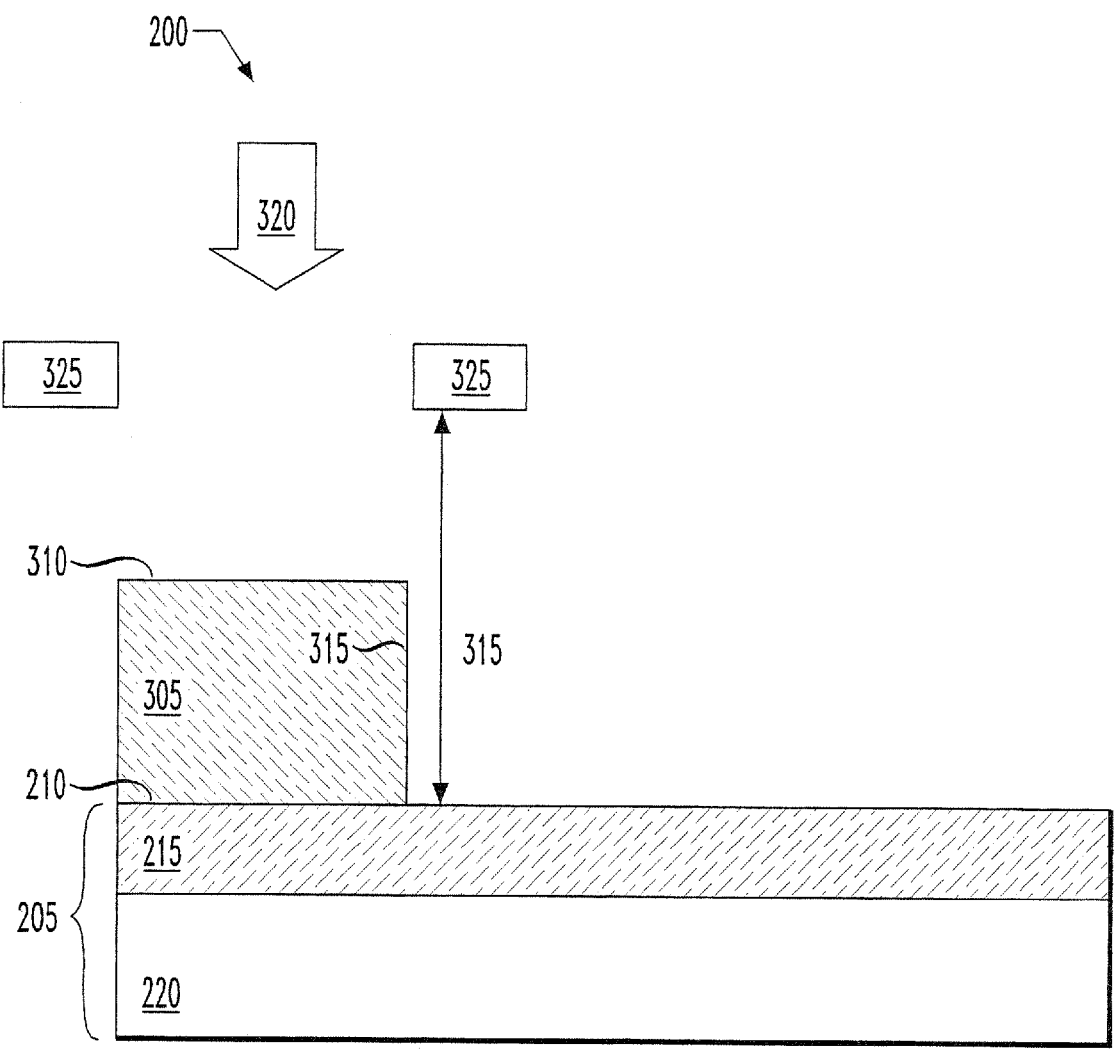

Referring now to FIG. 3, the method also includes forming a first electrode 305 on the planar surface 210 of the substrate 205, where the first electrode 303 has a top surface 310 and a lateral surface 315. The first electrode 305 can be formed by thermally evaporating a metal source 320, via electron beam evaporation. To facilitate the formation of an electrode whose lateral surface 315 is normal to planar surface 210, a collimated vapor beam deposition method is used. As an example, the metal source 320 is positioned normal to the planar surface 210, with a shadow mask 325 located near (e.g., a distance 330 of less than about 10 nanometers, and more preferably, in contact with) the planar surface 210. In some preferred embodiments, the metal source 320 is gold, although other metals, such as those enumerated above, can be used.

Figure 4:
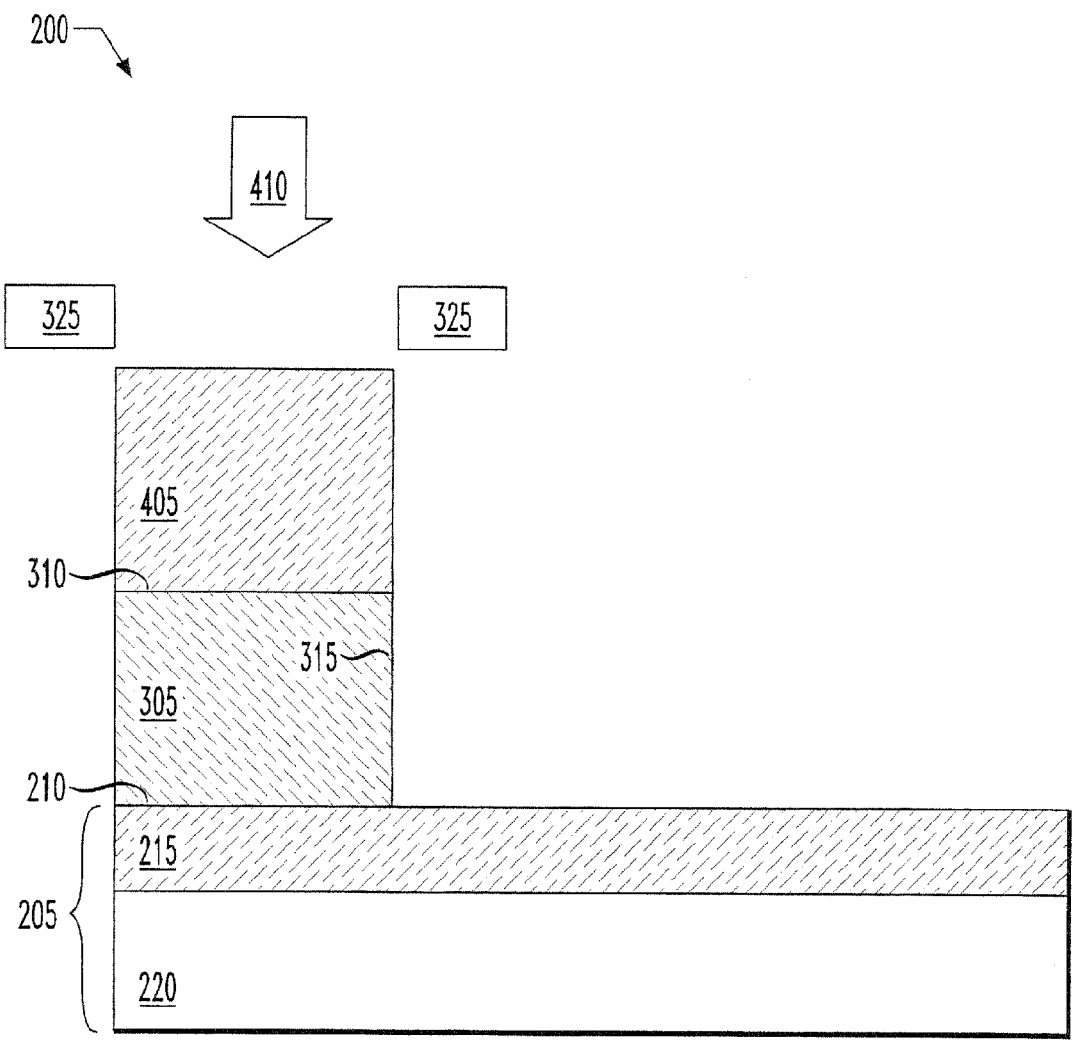

Turning now to FIG. 4, shown is the apparatus after forming an electrode insulating layer 405 on the top surface 310 of the first electrode 305. The electrode insulating layer 405 can be formed by thermally evaporating a dielectric source 410, via a collimated vapor beam deposition analogous to that described above, onto the top surface 310. In some preferred embodiments, the dielectric source 410 is silicon dioxide. As noted previously, it is desirable for the footprint of the electrode insulating layer 405 to be substantially aligned with the footprint of the first electrode 305. It is therefore advantageous for the metal source 320 (shown in FIG. 3) and dielectric source 410 (sown in FIG. 4) to be in substantially coincident locations relative to the planar surface 210 and shadow mask 325. Alternatively, the stacked structure shown in FIG. 4 can be formed from layers of the first electrode 305 and insulating layer 405 and then laterally defined by removing lateral portions of the stack via cutting with a focused ion beam or by conventional lithography and etching.

Figure 5:
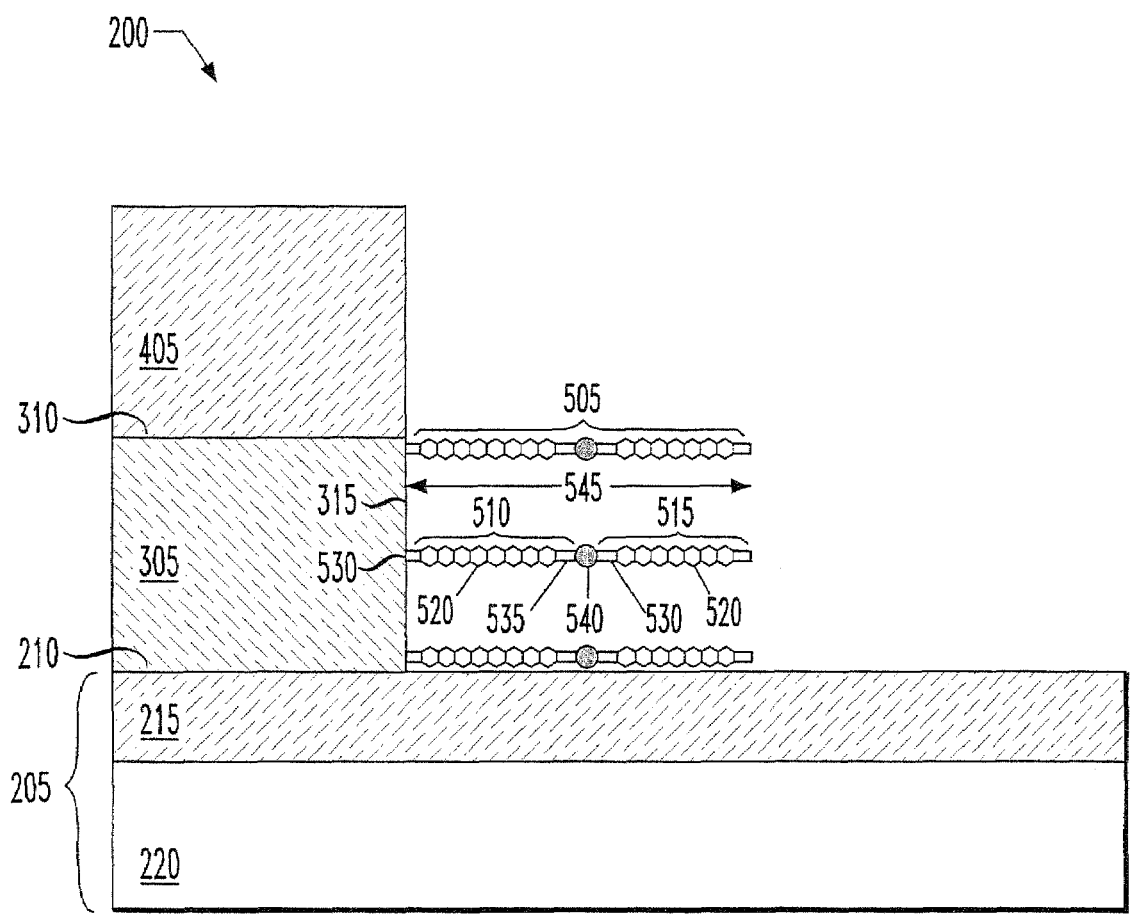

Turning now to FIG. 5, illustrated is an apparatus 200 that is produced by forming a self-assembling layer 505 on the lateral surface 315 of the first electrode 305. As noted previously, to form a layer 505 that is more robust against the penetration of conductive particles, it is advantageous for the self-assembling layer to comprise a stack of at least two self-assembled monolayers 510, 515. In some preferred embodiments, the stack of self-assembled monolayers 510, 515 is formed by depositing the first organic molecules 520 of the first self-assembling monolayer 510 on the lateral surface 315, and then bonding the first organic molecules 520 to the second organic molecules 525 to form the second self-assembling monolayer 515.

For example, first organic molecules 520 comprising mercaptoundecanoic acid (MUA) can be deposited on the lateral surface 315 to form a first self-assembled monolayer 510, by exposing the lateral surface to a 1 mM solution of MUA in ethanol for at least about 10 minutes, and preferably at least about 24 hours. During substantially the same period, first end groups 530, comprising mercapto-groups, bond to the lateral surface 315 of a gold first electrode 305. Second end groups 535, comprising carboxyl groups, are then bonded to second organic molecules 525, also comprising MUA, to form a stack including the second self-assembling monolayer 515. Bonding between layers 510, 515 is achieved by exposing the first self-assembled layer of MUA molecules 510 to a coupling agent 540 comprising a 1 mM solution of Cu(ClO$_4$)$_2$ in ethanol for about 3 minutes. This is followed by rinsing in ethanol and exposure to a solution of the second organic molecules 525. In some cases, the solution of second organic molecules 525 can be substantially the same solution of MUA in ethanol used to form the first layer MUA molecules 510. The first and second organic molecules 510, are thereby linked together through metal-sulphur covalent bonds. Moreover, the process of alternating exposing the lateral surface 315 to organic molecules 520, 525 and the coupling agent 540 can be repeated any number of times to link multiple stacks self-assembling layers 510, 515 together. As an example, two to seven layers of MUA 510, 515 can be grown in this fashion to form a self-assembled layer 505 having a thickness 545 of between about 2 and about 11 nanometers, and more preferably between about 8 and about 11 nanometers. Of course other procedures, well known to those skilled in the art, can be used to link the first and second self-assembling monolayers 510, 515. See e.g., Evans et al., J. Am. Chem. Soc. 113, 5866 (1991), incorporated by reference herein in its entirety.

As noted above, the self-assembling layers 510, 515 can be made of the first or second organic molecules 520, 525 that are nonconductive or semiconductive, or a mixture or both. Moreover, the first and second organic molecules 520, 525 can be the same or different from each other. It is also within the scope of the present invention to introduce additional different organic molecules into the self-assembling layer 505. In some embodiments, it is advantageous for the organic molecules 520, 525 to be functionalized with groups such as mercapto- or carboxyl-groups to facilitate coupling between the organic molecules 520, 525 or the lateral surface 315. Of course, other functional groups such as isocyanide groups can be used. Substantially the same steps as described above could be followed to link the first and second self-assembling monolayers 510, 515 comprising semiconductive organic molecules 520, 525.

Figure 6:
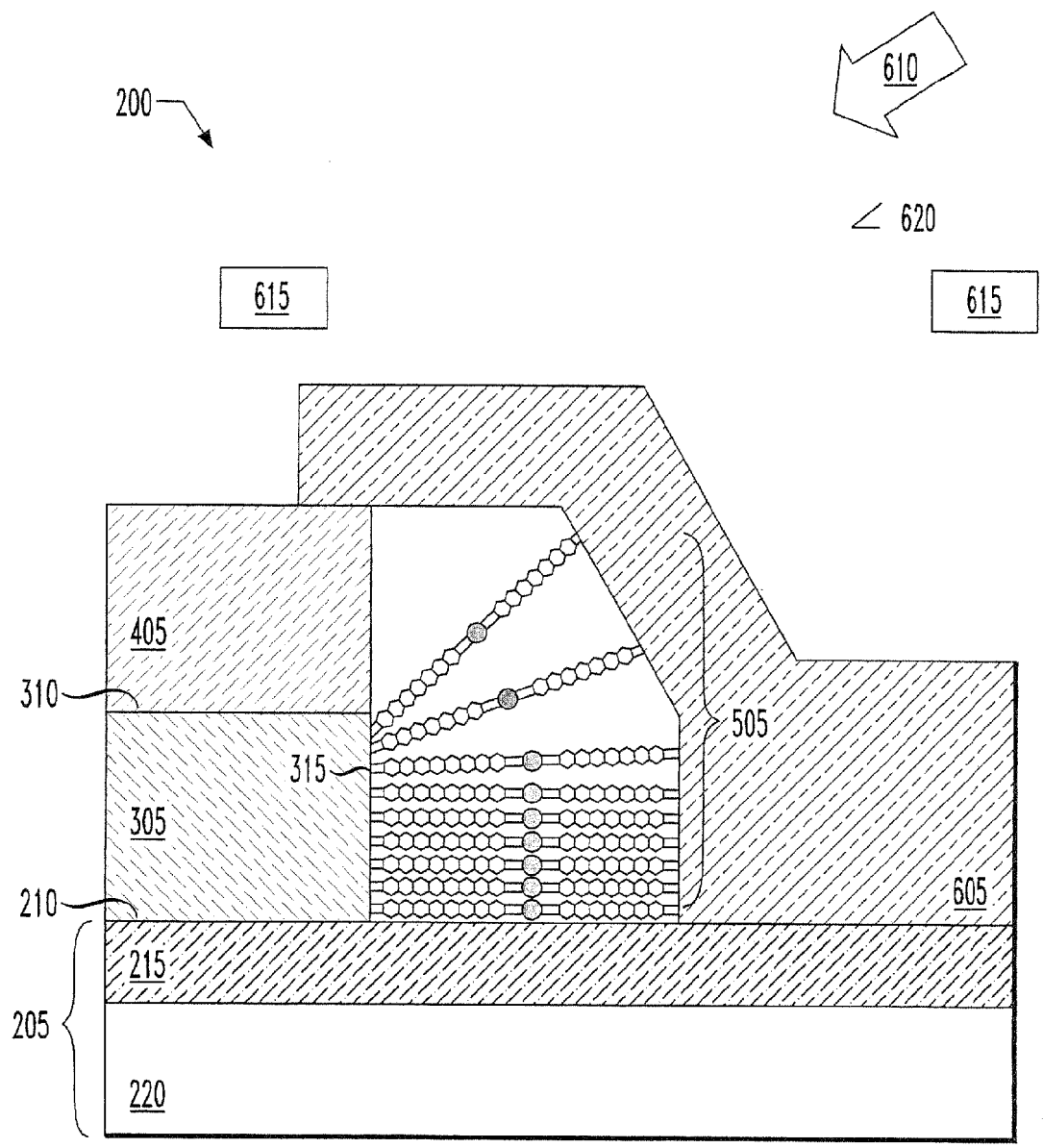

Referring now to FIG. 6, shown is the apparatus 200 after forming a second electrode 605 on the planar surface 210. The second electrode 605 is also in contact with both the self-assembling layer 505 and the electrode insulating layer 405. In some embodiments, the contact with either or both the self-assembling layer 505 and the electrode insulating layer 405 is facilitated through the formation of covalent bonds. The second electrode 605 can be formed by electron beam evaporation, similar to that used to form the first electrode 305. In certain preferred embodiments, the second electrode 605 comprising gold, is formed by evaporating a gold source 610 through a shadow mask 615 at a shallow angle 620, for example, between about 20 and about 40 degrees. The use of a shallow angle facilitates contact between the second electrode 605 and the self-assembling layer 505 and the electrode insulating layer 405. It is also advantageous to perform the evaporation of gold at a low rate (e.g., about 0.6 nanometers per minute) and maintaining the apparatus at a low temperature (e.g., about 100° K.) during the formation of the second electrode 605, to avoid thermal damage to the self-assembled layer 505.

Figure 7:
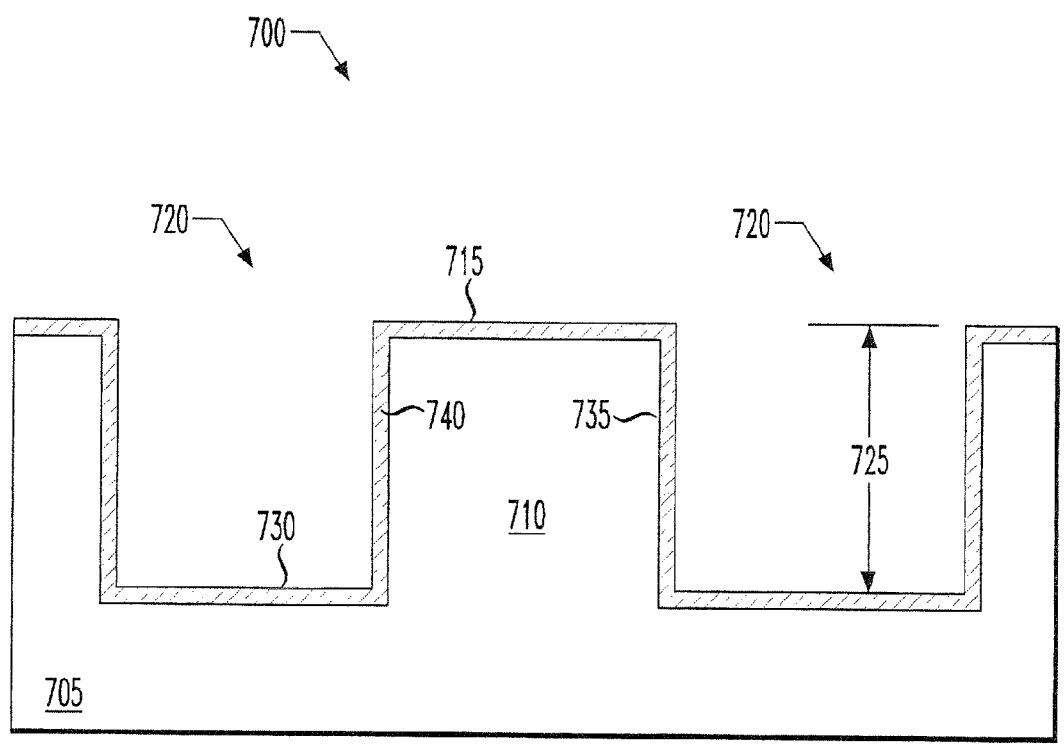
FIGS. 7 to 11 schematically illustrate sectional views of structures produced by an exemplary alternative method of the present invention at various stages of manufacture.

FIGS. 7 to 11 illustrate selected steps in an alternative preferred method for manufacturing an apparatus 700. Again, any of the previous mentioned materials and structures can be used in the alternative method. Turning first to FIG. 7, a substrate 705 is provided by forming a portion of the substrate into a pillar 710 having a planar surface 715. The pillar 710 can be formed by creating a trench 720 in the substrate 705 using conventional lithographic processes. In some preferred embodiments, the pillar has height 725 of at least about 1000 nanometers from the trench floor 730. It Is also desirable for the lateral sides of the pillar 735 to be substantially normal to the trench floor 730. In other embodiments, at least a portion of the substrate 705, such as the pillar 710, is doped silicon and a conformal insulating layer 740 is formed over the substrate 705.

Figure 8:
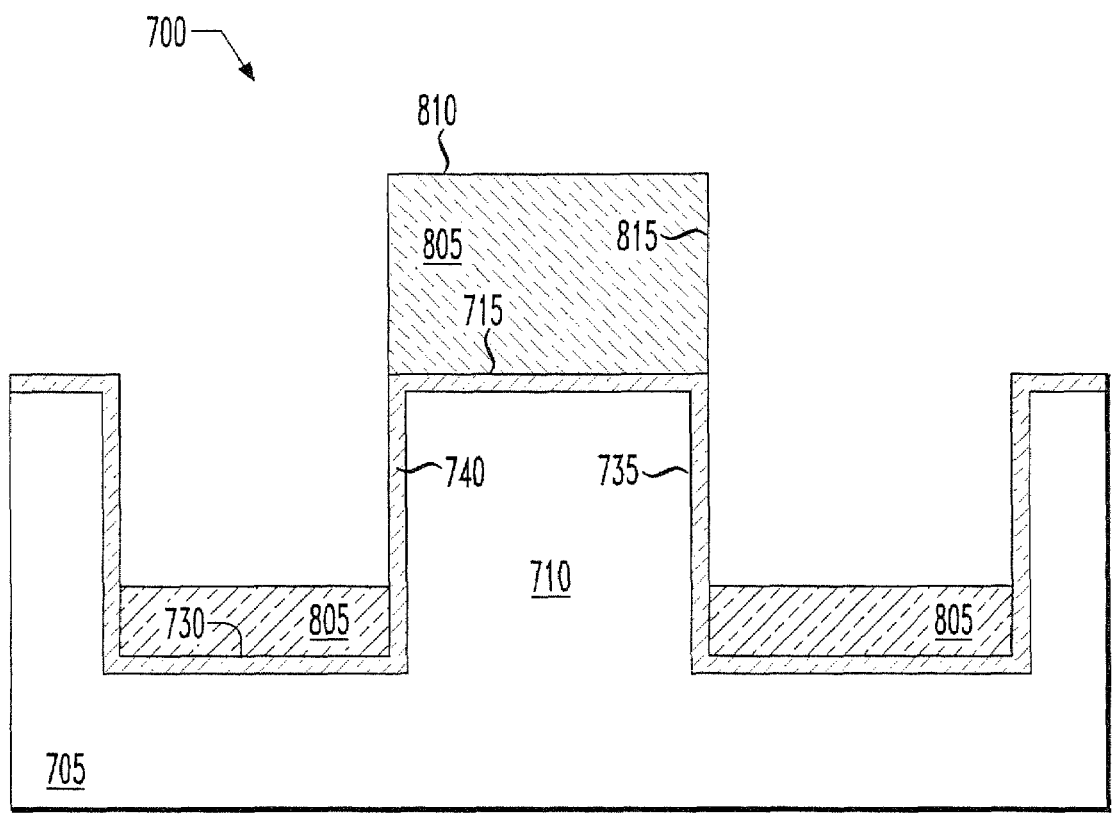
Figure 9:
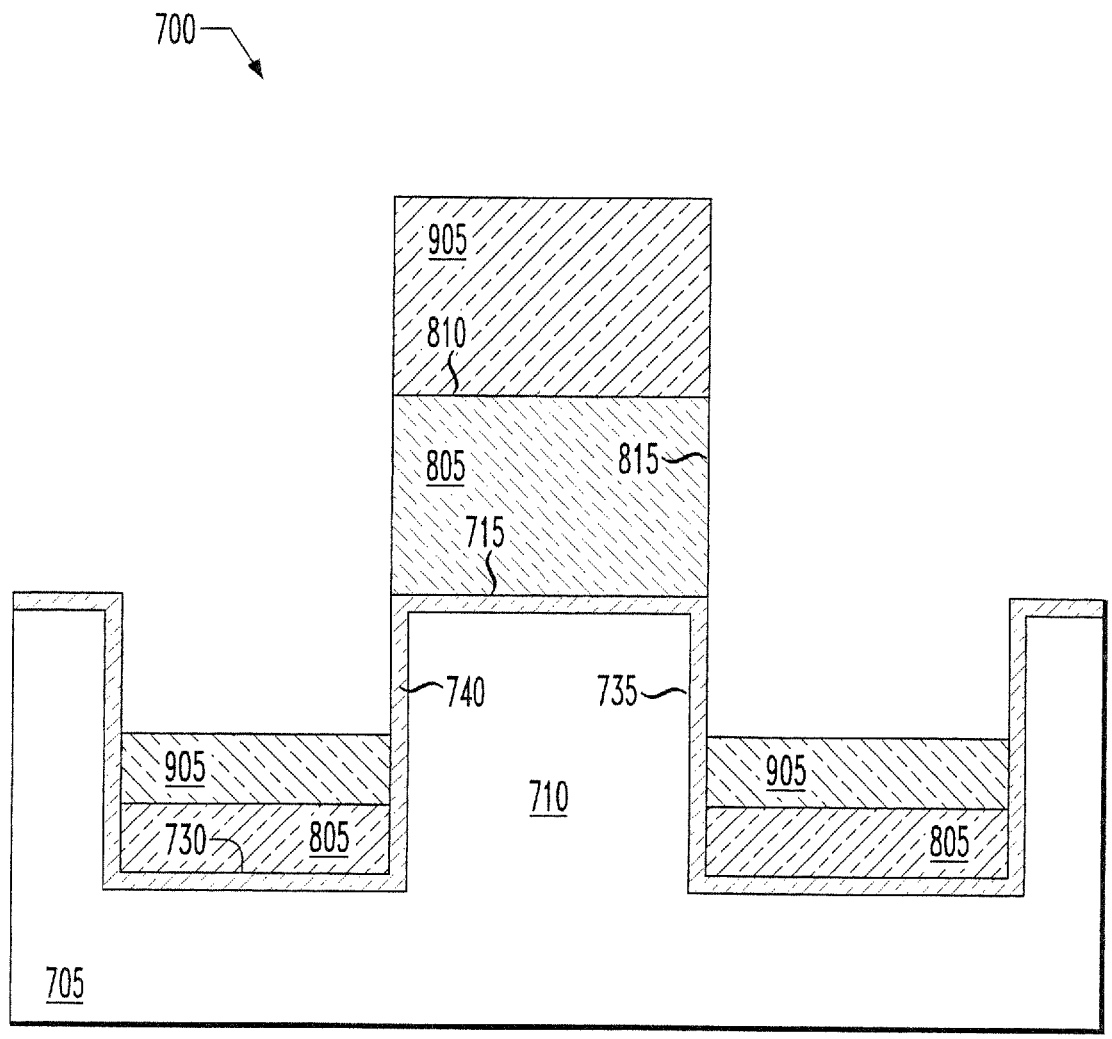

Turning now to FIG. 8, shown is the apparatus 700 after forming a first electrode 805, having a top 810 and lateral surface 815, on the planar surface 715 of the substrate 705. Similar procedures can be used to form the first electrode 805 as described above. As further illustrated in FIG. 9, an electrode insulating layer 905 is formed on the top surface 810 of the first electrode 805. Forming the electrode insulating layer 905 on the first electrode 805, which in turn is formed on the pillar 710, advantageously promotes alignment between the first electrode 805 the electrode insulating layer 905. As indicated in FIGS. 8 and 9, the first electrode 805 and electrode insulating layer 905 can also be formed over the trench floor portion.

Figure 10:
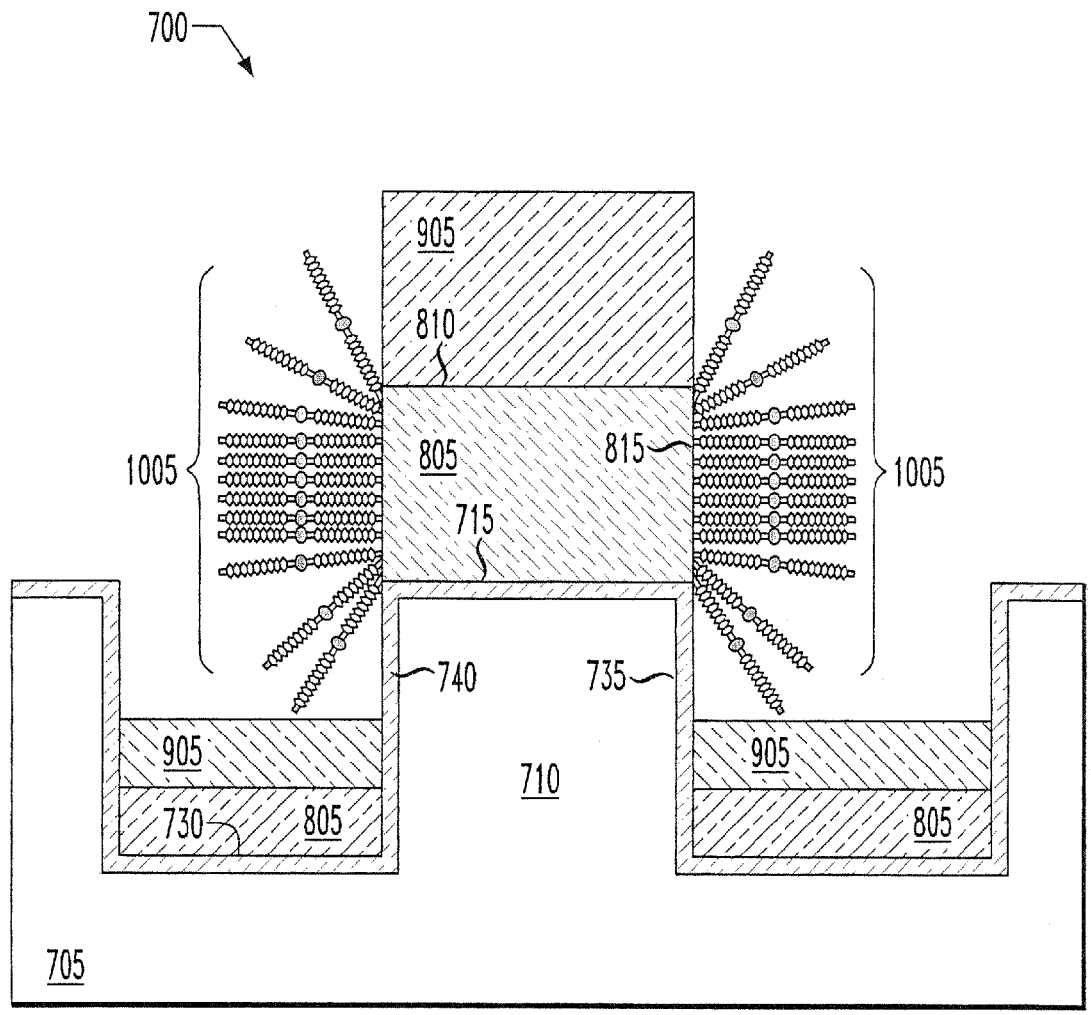
Figure 11:
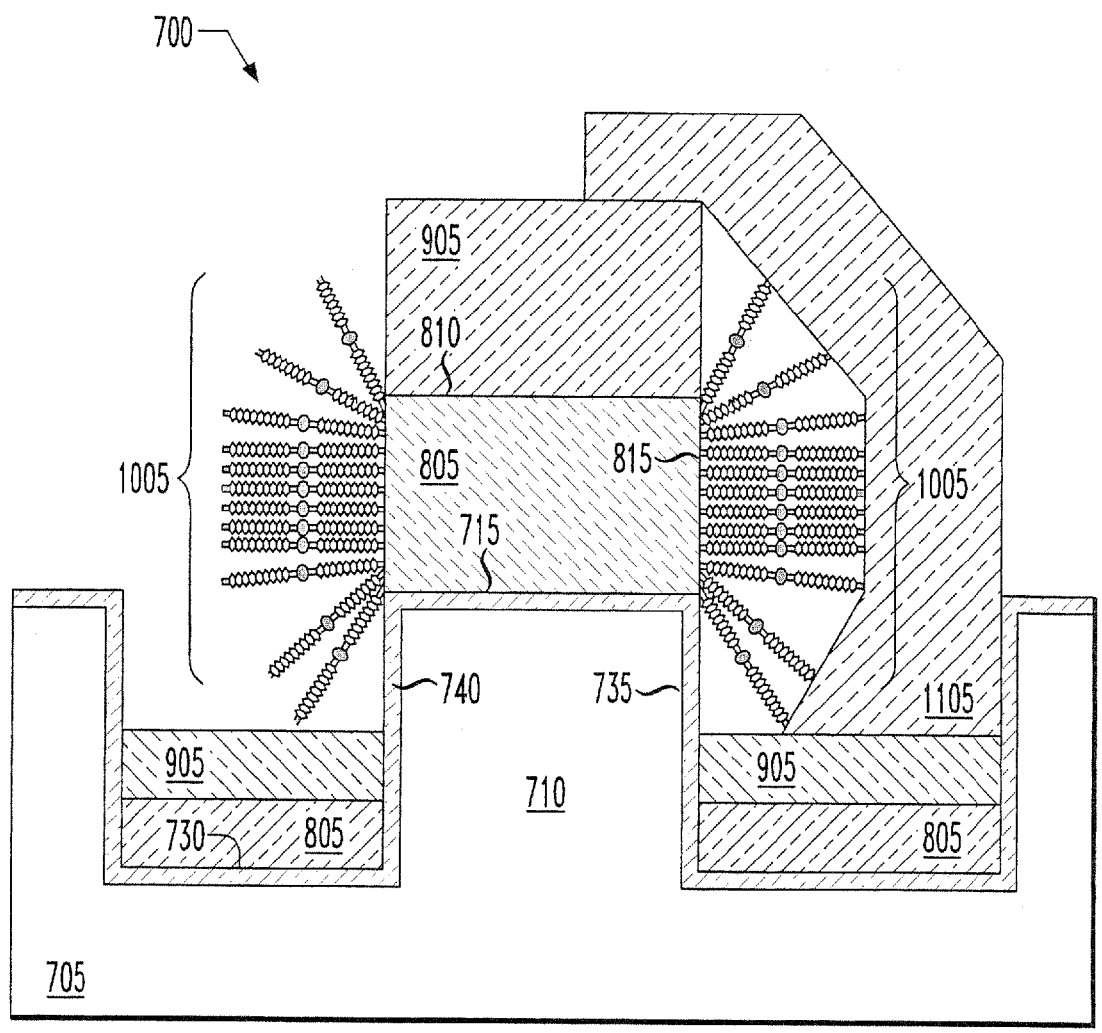

Turning now to FIG. 10, a self-assembling layer 1005 is formed on the lateral surface 815 of the first electrode 805, analogous to that described above. Referring now to FIG. 11, illustrated is the apparatus 700 after forming a second electrode 1105 on the planar surface 715, such that the second electrode 1105 is in contact with both the self-assembling layer 1005 and the electrode insulating layer 905. Previously described procedures can be used to form the electrode insulating layer 905, self-assembling layer 1005, and second electrode 1105.

In some embodiments, the apparatus 700 that is produced by the above-described method is an organic field effect transistor, wherein first and second electrodes 805, 1105 are source and drain electrodes of the transistor 700, and the substrate 705 is a gate structure. The above method preferably produces organic field effect transistors 700 with a yield of greater than about 90 percent, i.e., about 90 being without electrical defects. Such electrical defects could otherwise impede the ability of applied gate voltages in field effect transistors 700 to modulate current.

Although the present invention has been described in detail, those of ordinary skill in the art should understand that they can make various changes, substitutions and alterations herein without departing from the scope of the invention.

What is claimed is:

1. A method comprising,
    forming a first electrode on a planar surface of a substrate, said first electrode having a top surface and a lateral surface;
    forming an electrode insulating layer on said top surface;
    forming a self-assembling layer on said lateral surface; and
    forming a second electrode on said planar surface such that said second electrode is in contact with both said self-assembling layer and said electrode insulating layer.

2. The method of claim 1, wherein said self-assembling layer comprises a stack of at least two self-assembled monolayers.

3. The method of claim 1, wherein forming said self-assembling layer comprises linking ends of self-assembling monolayers together through metal-sulphur bonds.

4. The method of claim 1, wherein said self-assembling layer comprises nonconductive organic molecules.

5. The method of claim 1, wherein said self-assembling layer comprises semiconductive organic molecules.

6. The method of claim 1, further comprises forming an organic field effect transistor, said first and second electrodes being source and drain electrodes of said transistor.

7. The method of claim 1, further comprises forming an organic field effect transistor, wherein a yield of said transistors having an absence of electrical defects is greater than about 90 percent.

8. The method of claim 1, wherein said first electrode and electrode insulating layer are formed using collimated vapor beam deposition such that a footprint of said electrode insulating layer is substantially aligned with said top surface.

9. The method of claim 1, wherein said first and second electrodes are in contact with opposite sides of said electrode insulating layer.

10. The method of claim 1, wherein said second electrode overhangs said first electrode.

11. The method of claim 1, wherein a thickness of said electrode insulating layer is greater than a separation distance between said first electrode and said second electrode.

12. The method of claim 2, wherein said stack is formed by depositing a first self-assembling monolayer of organic molecules on said lateral surface and bonding ends of said organic molecules to ends of organic molecules of a second self-assembling monolayer.

13. The method of claim 3, wherein said linking ends comprises alternating exposing said lateral surface to self-assembling organic molecules and a coupling agent.

14. The method of claim 13, wherein said coupling agent comprises cupric perchlorate and said self-assembling organic molecules comprise mercapto-functionalized organic molecules.

* * * * *